Feb. 22, 1955 M. J. ARVIN 2,702,828

THERMOELECTRIC GENERATOR AND METHOD FOR PRODUCTION OF SAME

Filed June 3, 1950 2 Sheets-Sheet 1

INVENTOR.
Martin J. Arvin,
BY
Brown, Jackson, Boettcher & Dienner
Attys

Feb. 22, 1955 M. J. ARVIN 2,702,828
THERMOELECTRIC GENERATOR AND METHOD
FOR PRODUCTION OF SAME
Filed June 3, 1950 2 Sheets-Sheet 2

INVENTOR.
Martin J. Arvin,
BY
Brown, Jackson, Boettcher & Dienner
Attys

United States Patent Office 2,702,828

Patented Feb. 22, 1955

2,702,828

THERMOELECTRIC GENERATOR AND METHOD FOR PRODUCTION OF SAME

Martin J. Arvin, Carterville, Ill., assignor to Milwaukee Gas Specialty Company, Milwaukee, Wis., a corporation of Wisconsin Application June 3, 1950, Serial No. 165,893

9 Claims. (Cl. 136—4)

This invention relates, in general, to a thermoelectric generator, and has particular relation to a thermoelectric generator in the form of a thermopile comprising a plurality of thermocouples connected in series; also to a thermocouple which may be used as such, or readily combined with similar thermocouples to produce a thermopile; and to the thermopile produced by the combination of such thermocouples, as well as to the method for the production of the thermoelectric generators.

The present invention may be characterized as a development in the invention in thermoelectric generators and method for production of same disclosed and claimed in the copending application of Oscar J. Leins, Serial No. 163,708, filed May 23 1950.

In prior practice, it has been customary to form and join the dissimilar elements of thermoelectric generators individually to form the thermoelectric junctions. Such prior practice is not as rapid and economical as may be desired. This is particularly so where the thermoelectric generator is in the form of a thermopile having a multiplicity of dissimilar thermoelectric generator elements and a multiplicity of junctions between such elements.

Prior thermoelectric generators in the form of thermopiles have also been confronted with limitations in the number of thermoelectric generator elements and thermoelectric junctions that could be practicably provided, and they have been confronted with limitations in the manner and positions in which they could be used.

One of the main objects of the present invention is to provide an improved thermoelectric generator, and, more particularly, an improved thermoelectric generator in the form of a thermopile which can be produced more rapidly and economically.

Another object of the invention is to provide an improved thermoelectric generator, and, more particularly, an improved thermoelectric generator in the form of a thermopile having a multiplicity of dissimilar thermoelectric generator elements and a multiplicity of junctions between such elements and in which the thermoelectric generator elements and the thermojunctions are arranged in an improved and advantageous relation and adapted to be positioned in relation to the source of heat for the hot thermojunctions in an improved and advantageous manner.

Another object of the invention is to provide in a thermoelectric generator of the class described an improved form of support for the thermoelectric generator elements and an improved arrangement of the thermoelectric generator elements on the support.

Another object of the invention is to provide an improved thermoelectric generator support and an improved arrangement of the thermoelectric generator elements on the support, all to the end of providing a thermoelectric generator that may be readily positioned or assembled about a hot water pipe, hot air stack or similar device for heating the hot junctions of the thermoelectric generator.

Another object of the invention is to provide an improved form of thermoelectric generator in which the dissimilar thermoelectric generator elements are deposited upon a surface by printing, evaporating, plating, painting, spraying, chemical deposition, vacuum processes, dusting, or in any other equivalent manner. Thermoelectric generators produced by any of these methods will be considered herein under the general classification of printed thermoelectric generators.

Another object of the invention is to provide an improved method of making thermoelectric generators according to the present invention.

Other objects and advantages of the invention will be apparent from the following detailed description and the accompanying drawings.

Figure 1:
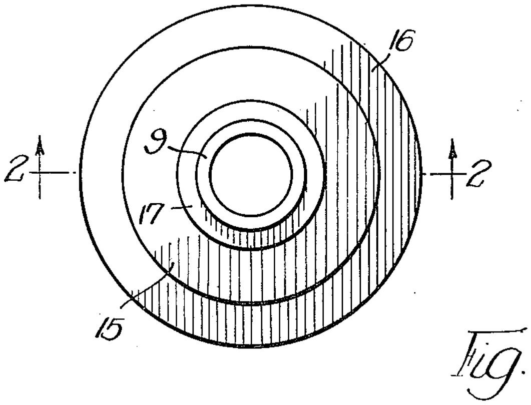
Figure 1 is a top plan view of one form of thermoelectric generator embodying the present invention.
Figure 3:
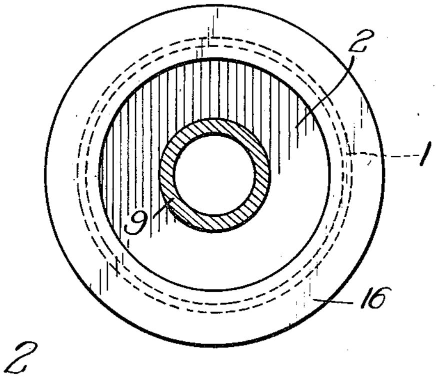
Figure 3 is a transverse sectional view taken along the line 3—3 of Figure 2.
Figures 2, 4:
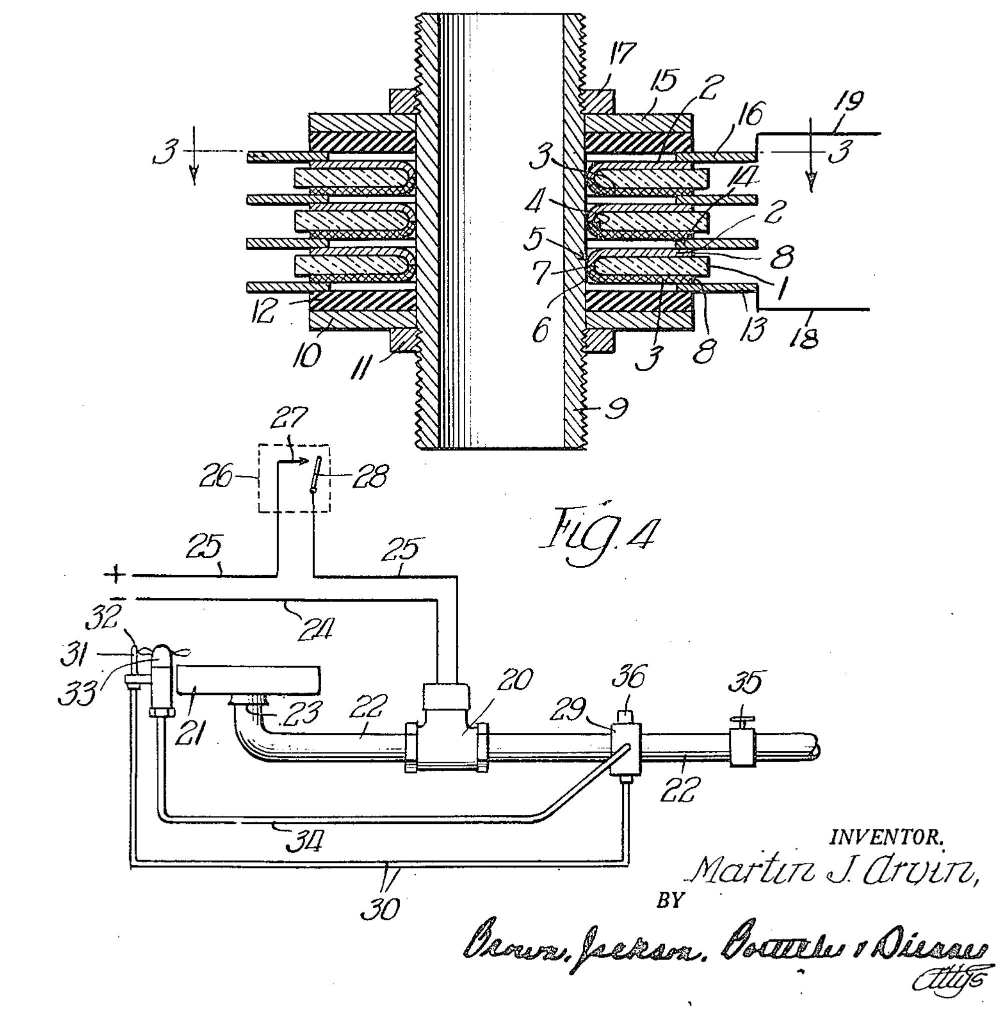
Figure 2 is a sectional view taken in a longitudinal axial plane along the line 2—2 of Figure 1.
Figure 4 is a view showing diagrammatically one illustrative control circuit with which the thermoelectric generator is adapted for use.

Referring first to Figures 1–3 of the drawings, the embodiment of the invention therein illustrated shows more or less schematically one form of thermoelectric generator embodying the present invention.

According to this embodiment of the invention, annular discs 1, formed of suitable thermoelectric insulating material, are coated on one side with a thermoelectrically positive material, such as Chromel, to form a positive thermoelectric generator element 2. The other side of each disc 1 is coated with a thermoelectrically negative material such as constantan to form negative thermoelectric generator elements 3.

While particular dissimilar metals in the thermoelectric series are mentioned above, it is to be understood that either of the thermoelectric generator elements may, for example, be formed of stainless steel, copel, constantan, Chromel, or any other metal in the thermoelectric series well known in the art, and that the other thermoelectric generator elements may be formed of the opposite or dissimilar metal separated in the thermoelectric series from the metal from which the other thermoelectric generator elements are formed.

It is to be further understood that the present invention is not, in its broader aspects, limited to use of thermoelectric generator elements made of dissimilar metals. The elements 2 and 3 may be formed from dissimilar thermoelectric alloys, or from other dissimilar thermoelectric materials which when joined together and heated at the hot junctions will produce a thermoelectric current. The appended claims are to be construed accordingly.

The discs 1 may be formed of ceramic material or of any other suitable thermoelectric insulating material such, for example, as asbestos paper, asbestos cloth, or other paper or cloth, or of mica, synthetic mica, filled cloth, or any other suitable material. The discs 1 are also preferably of refractory character, at least to the extent to withstand the heat to which the hot junctions of the thermoelectric generator are subjected in use.

The materials forming the thermoelectric generator elements 2 and 3 may be applied to the opposite surfaces of the discs 1 by any one of the metal spraying processes familiar to those versed in the art, or the materials forming the thermoelectric generator elements 2 and 3 may be applied in paste form and baked onto the discs. The thermoelectric generator element materials may also, within the scope of the present invention, be deposited or applied to the opposite surfaces of the discs 1 by printing, evaporating, plating, chemical deposition, vacuum processes, dusting, or in any other equivalent or suitable manner. Deposition or application of conducting materials, particularly metals, to the surface of a support by any of these methods or by equivalent methods are known under the general classification of printing processes. Such processes are known in the art, and therefore will not be described in detail in the present application.

The material forming the thermoelectric generator elements 2, and the material forming the elements 3, overlap the inner edges or inner peripheries 4 of the discs 1 at the holes therein, and their contiguous edges 5 and 6 are joined to form thermojunctions 7. To assist in forming the thermojunctions 7, an intermediate metal or other suitable material may, if desired, be applied to the hole in the disc 1 to give better contact between the thermoelectric material on the upper side of the disc and the thermoelectric material on the lower or opposite side of the disc. When the thermoelectric generator is used as shown and described, these thermojunctions 7 constitute the hot junctions at the openings in the discs 1. This may, of course, vary. The outer peripheries 8 of the respective thermoelectric generator elements 2 and 3 are shown as stopping short of the outer edges or outer peripheries of the discs 1.

Each disc 1, with the dissimilar thermoelectric generator elements 2 and 3 on its opposite surfaces and joined to form the thermojunction 7 at the peripheries of the holes in the discs, constitutes a thermoelectric generator in the form of a thermocouple of new and improved character.

These thermocouples are adapted to be assembled, for example, about a length of hot water pipe, steam pipe, hot air stack or the like indicated at 9, to provide an improved form of thermopile having a multiplicity of thermoelectric generator elements and a multiplicity of thermojunctions. Such a unit may be readily installed in a hot water system or in a hot air exhaust system, and in other advantageous relations.

As shown in Figure 2, a washer or ring 10, formed, for example, of iron or other suitable material, is placed around the pipe 9, with the pipe extending through the hole in the washer. The washer 10 seats, for example, against a clamping ring 11 which may be screwed into position on the pipe 9 or otherwise mounted in place. A ring 12 of suitable thermoelectric insulating material is placed around the pipe 9 and seats against the washer 10. A flat metal or other thermoelectric conducting ring 13 is placed on the ring 12. One of the thermocouples, comprising the disc 1 and the thermoelectric generator elements 2 and 3, is placed around the pipe 9, with, for example, the outer periphery of its thermoelectric generator element 3 contacting the ring 13. Another flat metal or conducting ring 14 is placed around the pipe 9 so as to make contact with the outer periphery of the dissimilar thermoelectric generator element 2.

As many thermocouple discs and metal connecting rings may be assembled about the stack or pipe 9 as the particular application requires. In the particular form of the device illustrated in the drawing, and insulating ring or washer 15 is stacked around the pipe 9 and against the adjacent metal or other thermoelectric conducting ring 16, and is clamped in place, for example, by a clamping ring 17 screwed into position on the pipe 9 or otherwise mounted in place.

There is thus formed a thermoelectric generator in the form of a thermopile with any desired number of alternately dissimilar thermoelectric generator elements 2 and 3 and thermojunctions 7 bound together endwise on the pipe 9 between the clamping rings 11 and 17. The thermojunctions 7 constitute the hot thermojunctions, and they are thus in direct contact with the pipe 9 or are exposed directly to the heat of this pipe. The metal rings, of which the rings 13, 14, and 16 are illustrative, serve as cold junctions for the dissimilar thermoelectric generator elements 2 and 3 which are connected in series circuit relation by these rings, and the rings also serve as cooling fins for the cold junctions of the thermoelectric generator.

By attaching a lead conductor 18 to the lowermost conducting ring 13 in contact with the first element 3 and a lead conductor 19 to the uppermost conducting ring 16 in contact with the last element 2, the thermoelectric circuit may be completed.

The thermoelectric generator may be used for energizing, for example, a bucking coil of a control device of the type, in general, as shown and described in Thornbery and Wetzel Patent No. 2,340,234, patented January 25, 1944, or otherwise to shut off the flow of fuel to a main burner upon the occurrence of a predetermined condition; or it may be used with a thermoelectric shut-off valve having an electromagnet provided with a coil which, when energized, holds a safety shut-off valve in open position as shown and described in Oscar J. Leins Patent No. 2,126,564, patented August 9, 1938; or with a thermoelectric switch of the type shown and described in Clarence Wantz Patent No. 2,190,303, patented February 13, 1940; or with a bleed control for a diaphragm valve of the type shown and described in Wunsch and Schuppert Patent No. 2,291,567, patented July 28, 1942; or with a control device of the type shown and described in Lourdes V. McCarty Patent No. 2,349,443, patented May 23, 1944; or with any other suitable device for energization by the thermoelectric generator.

Figure 4 shows, for purposes of illustration, a system in which a main gas valve 20 is operated directly by the output of the thermopile. The valve 20 may be of the type shown and described in Lourdes V. McCarty Patent No. 2,349,443. Alternatively the valve 20 may be of the type having a bleed control and in which the valve is under the control of the bleed control and the pressure of the gaseous fuel, for example, as in Wunsch and Schuppert Patent No. 2,291,567.

The burner shown at 21 is a main burner. It may be the main burner for a room or space heater, or it may be the main burner for a water heater or for a floor furnace, an oven burner, one or more top burners for a gas range, or any other burner and of any suitable construction.

A fuel supply pipe or conduit 22 leads to the burner 21 for the delivery of gaseous or other fuel thereto, for example, through a mixing chamber 23 to which air is admitted through adjustable air inlets (not shown), as well understood in the art. The valve 20 provides, for example, for automatic control of the flow of gas to the burner 21 through the conduit 22. Where the valve 20 is, for example, of the type shown and described in Wunsch and Schuppert Patent No. 2,349,443, its coil or winding (not shown) is connected by lead conductors 24 and 25 in circuit with the lead conductors 18 and 19 of the thermopile shown in Figures 1–3, thus connecting the thermopile and the coil of the valve 20 in series circuit relation. This may vary.

One of the conductors 24, 25 (for example, the conductor 25) may be provided with a thermostat 26 or other condition responsive device having contacts 27 and 28 for opening and closing the circuit of the thermoelectric generator responsive to a temperature or other condition to which the device 26 is responsive.

The fuel supply conduit 22 may, if desired, be provided with a thermoelectric safety shut-off valve 29, for example, in general of the type shown and described in Oscar J. Leins Patent No. 2,126,564, or of other form. The electromagnet of the valve 29 may have its coil (not shown) connected by lead conductors 30 in circuit with a thermocouple or other thermoelectric generator 31 positioned where its hot thermojunction 32 will be heated by the flame of a pilot burner 33 so that the thermoelectric generator 31 will be energized as long as the pilot burner 33 is ignited.

The pilot burner 33 is positioned to light the main burner 21 and is supplied with gaseous fuel through a tube or conduit 34 connected, for example, to the fuel supply conduit 22 through the valve 29, in general, in the manner shown and described in Henry F. Alfery Patent No. 2,276,909, patented March 17, 1942. A manually operable or other suitable gas cock 35 may be provided in the fuel supply conduit anterior of the valve 29. The safety shut-off valve 29 may be provided with a reset button 36.

If desired, auxiliary means—such as a battery or a manual cocking device—may be provided to hold the automatic valve 20 open during the initial warm-up period.

Figure 5:
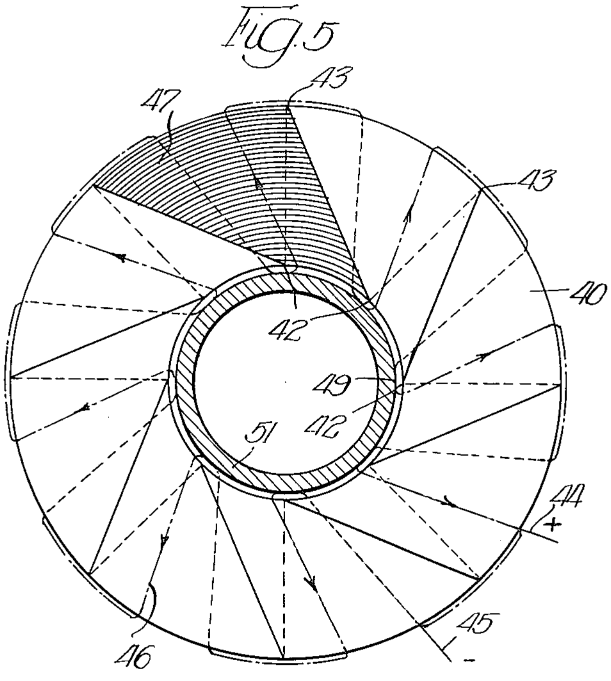
Figure 5 is a view similar to Figure 3 showing another form of thermoelectric generator embodying the present invention.
Figure 6:
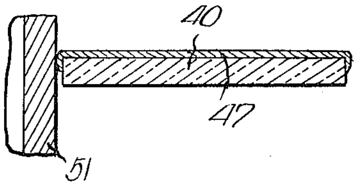
Figure 6 is a sectional view taken radially along the line 6—6 of Figure 5.
Figure 7:
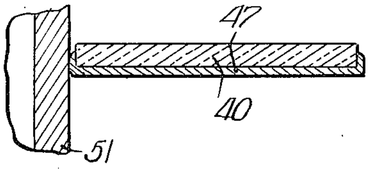
Figure 7 is a sectional view taken radially along the line 7—7 of Figure 5.

The embodiment of the invention illustrated in Figure 5 shows how a thermopile having a plurality of thermojunctions on the same disc may be provided within the scope of the present invention.

In this embodiment of the invention the disc 40 may be formed of ceramic material, or of any other suitable thermoelectric insulating material such, for example, as the materials previously mentioned in connection with the discs 1. The annular disc 40 is formed with ribs or ridges 41 across its opposite faces and joining across the inner and outer edges or peripheries of the disc.

After the two dissimilar thermoelectric generator element metals, alloys, or other materials are sprayed or otherwise applied as previously described to the opposite sides of the discs 40, with their inner and outer contiguous ends joined to form thermojunctions 42 and 43, the discs may, for example, be ground to knock off or remove the metal from the ribs or ridges. The result is a metallic path, for example, from 45 to 44 as indicated by lines with arrows 46. This path is much as if a ribbon with alternate sections of dissimilar thermoelectric element material 47 and 48 and with alternate junctions 42 and 43 were wound helically through the hole or opening 49 in the disc and over the outer periphery of the disc.

The junctions 42 along the inner periphery of the annular disc 40 may, for example, constitute the hot junctions, and the junctions 43 along the outer periphery of the disc may constitute the cold junctions of the thermoelectric generator. This, of course, may vary.

In the example shown in the drawings, eight hot junctions 42 are provided on the disc 40 but the number of junctions and the number of dissimilar thermoelectric generator elements may vary within the scope of the present invention. One or more of these discs 40 may be slipped over a hot water pipe, steam pipe, hot air stack or the like indicated at 51, with the junctions 42 in direct contact with the pipe 51 or exposed to the heat of this pipe and with the junctions 43 acting as cold junctions. Where a plurality of these discs are used, it is to be understood the plurality of alternately dissimilar thermoelectric generator elements 47 and 48 on adjacent discs will be connected in the desired circuit relation, for example, by placement of the discs on the pipe 51.

Figure 8:
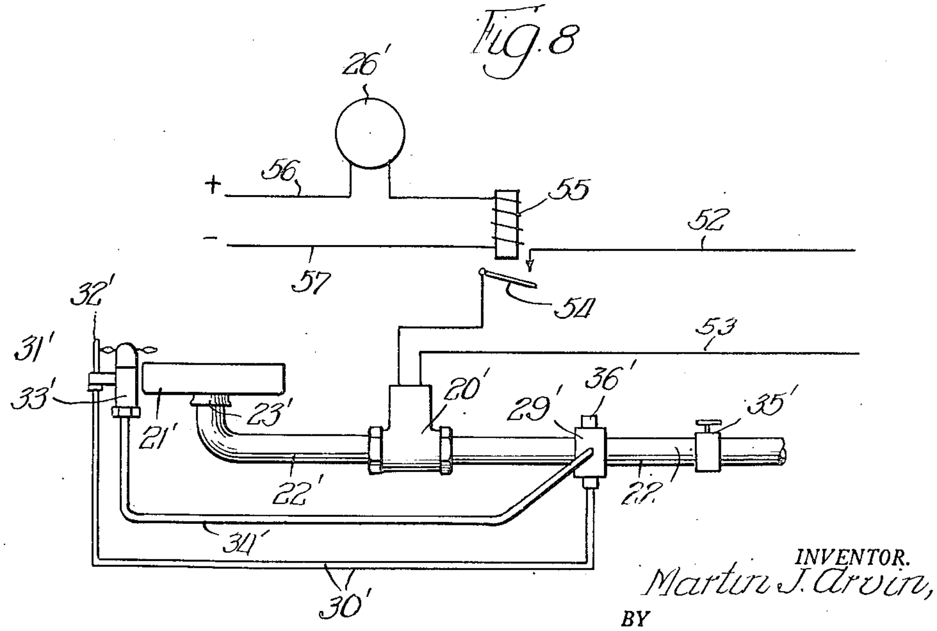
Figure 8 is a diagrammatic view showing another illustrative control circuit with which the thermoelectric generator is adapted for use.

The system and control circuit shown in Figure 8 is similar to the system and control circuit shown in Figure 4 except that the valve 20′ is a solenoid valve or electroresponsive valve having a supply circuit 52, 53 connected, for example, to a suitable voltage source and provided with a switch arm 54 under the control of a relay 55. The relay circuit may be provided with a thermostat or other condition responsive device 26′, and has conductors 56 and 57 for connection to the terminals of the thermoelectric generator, for example, at 44 and 45. Other parts of the system shown in Figure 8 which correspond to parts shown in Figure 4 are indicated by primed reference characters corresponding to the reference characters used in Figure 4.

The embodiments of the invention shown in the drawings are for illustrative purposes only, and it is to be expressly understood that said drawings and the accompanying specification are not to be construed as a definition of the limits or scope of the invention, reference being had to the appended claims for that purpose.

I claim:

1. A thermoelectric generator comprising an annular electrically insulating disc having a generally axial opening therein, a first thermoelectric generator material in the form of a circumferentially continuous coating disposed solely on one side of said disc and partially around the inner edge of said disc at the periphery of said opening, and a second dissimilar thermoelectric generator material in the form of a circumferentially continuous coating disposed solely on the other side of said disc, and partially around the inner edge of said disc at the periphery of said opening and meeting and electrically joined endwise along the inner edge of the disc at the periphery of the opening therein to the contiguous edge of said first thermoelectric generator material to form a thermojunction which is circumferentially continuous about the periphery of said opening.

2. In a device of the class described, in combination, a tubular member adapted to conduct a heated fluid, a plurality of annular electrically insulating discs having generally axial openings therein and stacked on said tubular member and encircling the same, a first thermoelectric generator material in the form of a circumferentially continuous coating disposed solely on one side of each of said discs and partially around the inner edge of the disc at the periphery of the opening therein, a second dissimilar thermoelectric generator material in the form of a circumferentially continuous coating disposed solely on the other side of each of said discs and partially around the inner edge of the disc at the periphery of the opening therein and meeting and joined endwise along the inner edge of the disc at the periphery of the opening therein to the contiguous edge of said first thermoelectric material to form inner thermojunctions which are circumferentially continuous about the peripheries of the openings in said discs, annular electric conducting rings secured against the outer marginal portions of the dissimilar thermoelectric generator materials at opposite ends of said stacked rings and affording outer thermojunctions and lead connectors for said thermoelectric generator, and at least one intermediate annular electric conducting ring secured between the outer marginal portions of intermediate dissimilar thermoelectric generator materials, said intermediate annular conducting ring providing at least one outer thermojunction and spacing the intermediate dissimilar thermoelectric generator materials axially between said inner and outer thermojunctions.

3. A device according to claim 2 wherein the annular conducting rings project radially outwardly from the outer peripheries of said first and second thermoelectric generator materials and also project radially outwardly from the outer peripheries of said electrically insulating discs and constitute annular cooling fins for the outer thermojunctions.

4. A device according to claim 2 wherein there are clamping rings screwed on the tubular member and clamping the stacked discs together and said annular electric conducting rings in contact with the outer marginal portions of said thermoelectric generator materials.

5. A thermoelectric generator comprising an annular electrically insulating disc having a generally axial opening therein, a plurality of first thermoelectric generator elements in the form of coatings on only one side of said annular disc and extending partially around the inner and outer edges of the disc, and a plurality of dissimilar second thermoelectric generator elements in the form of coatings on only the opposite side of said annular disc and extending partially around the inner and outer edges of the disc and meeting and electrically joined endwise along the inner and outer annular edges of the disc to contiguous ends of said first thermoelectric generator elements to form annularly spaced thermojunctions at the inner and outer edges of the disc, the dissimilar thermoelectric generator elements at opposite ends of the annularly grouped and joined thermoelectric generator elements affording terminals for connecting the thermoelectric generator into a thermoelectric circuit.

6. A thermoelectric generator comprising an insulating plate having an opening therein, a first layer of thermoelectric generator material covering one side of said plate and extending partially around the inner edge of said plate at the periphery of said opening, and a second layer of dissimilar thermoelectric generator material covering the other side of said plate and extending partially around the inner edge of said plate at the periphery of said opening and electrically joined along the inner edge of said plate at the periphery of said opening to the adjacent edge of said first layer of thermoelectric generator material to form a thermojunction which is substantially continuous about the periphery of said opening.

7. A thermoelectric generator comprising an insulating plate having an opening therein, a first layer of thermoelectric generator material covering one side of said plate and extending circumferentially at its inner edge around said opening, and a second layer of dissimilar thermoelectric generator material covering the other side of said plate and extending circumferentially at its inner edge around said opening, the inner circumferentially extending edges of said first and second layers of thermoelectric generator material being electrically joined along the inner edge of said plate to form a thermojunction which is circumferentially continuous about the periphery of said opening.

8. An annular thermoelectric generator, comprising a plurality of annular electrically insulating disks having generally axial openings therein stacked in coaxial relation, a first thermoelectric generator material in the form of a coating disposed solely on one side of each of said disks and extending to the inner edge of the disk at the periphery of the opening therein, a second dissimilar thermoelectric generator material in the form of a coating disposed solely on the other side of each of said disks and extending to the inner edge of the disk at the periphery of the opening therein and electrically connected at the periphery of said opening to the contiguous edge of said first thermoelectric material to form inner thermojunctions at the peripheries of the opening in said disks, electric conducting members in circuit with the dissimilar thermoelectric generator materials at opposite ends of said stack of rings and affording outer thermojunctions and lead connectors for said thermoelectric generator, and at least one intermediate annular electric conducting ring secured between the outer marginal portions of the intermediate dissimilar thermoelectric generator materials, said intermediate annular conducting ring providing at least one outer thermojunction and spacing the intermediate dissimilar thermoelectric generator material axially between said inner and outer thermojunctions.

9. An annular thermoelectric generator, comprising a plurality of annular electrically insulating disks having generally axial openings therein stacked in coaxial juxtaposed relation, a first thermoelectric generator material in the form of a coating disposed solely on one side of each of said disks and partially around the inner edge of the disk at the periphery of the opening therein, a second dissimilar thermoelectric generator material in the form of a coating disposed solely on the other side of each of said disks and partially around the inner edge of the disk at the periphery of the opening therein and meeting and electrically joined along the inner edge of the disk at the periphery of the opening therein to the contiguous edge of said first thermoelectric material to form inner thermojunctions at the peripheries of the opening in said disks, annular electric conducting rings secured against the outer marginal portions of the dissimilar thermoelectric generator materials at opposite ends of said stack of rings and affording outer thermojunctions and lead connectors for said thermoelectric generator, and at least one intermediate annular electric conducting ring secured between the outer marginal portions of the intermediate dissimilar thermoelectric generator materials, said intermediate annular conducting ring providing at least one outer thermojunction and spacing the intermediate dissimilar thermoelectric generator materials axially between said inner and outer thermojunctions.

References Cited in the file of this patent

UNITED STATES PATENTS

| | | |
|---|---|---|
| 1,587,707 | Duch | June 8, 1926 |
| 1,638,943 | Little | Aug. 16, 1927 |
| 1,643,734 | Zworykin | Sept. 27, 1927 |
| 2,381,819 | Graves et al. | Aug. 7, 1945 |
| 2,629,757 | McKay | Feb. 24, 1953 |

FOREIGN PATENTS

| | | |
|---|---|---|
| 142,829 | Germany | July 16, 1903 |
| 11,641 of 1915 | Great Britain | July 6, 1916 |
| 233,810 | Great Britain | May 21, 1925 |